US009628652B2

(12) United States Patent
Tsujihara et al.

(10) Patent No.: US 9,628,652 B2
(45) Date of Patent: Apr. 18, 2017

(54) IMAGE READING DEVICE

(71) Applicant: KONICA MINOLTA, INC., Chiyoda-ku, Tokyo (JP)

(72) Inventors: Kiyohito Tsujihara, Toyokawa (JP); Shiro Umeda, Toyokawa (JP); Yuki Higuchi, Toyokawa (JP)

(73) Assignee: KONICA MINOLTA, INC., Chiyoda-Ku, Tokyo (JP)

( * ) Notice: Subject to any disclaimer, the term of this patent is extended or adjusted under 35 U.S.C. 154(b) by 0 days.

(21) Appl. No.: 15/093,813

(22) Filed: Apr. 8, 2016

(65) Prior Publication Data
US 2016/0316073 A1  Oct. 27, 2016

(30) Foreign Application Priority Data

Apr. 24, 2015  (JP) ................................ 2015-089403

(51) Int. Cl.
*H04N 1/00* (2006.01)
*H04N 1/04* (2006.01)
*H05K 1/00* (2006.01)

(52) U.S. Cl.
CPC ....... *H04N 1/0083* (2013.01); *H04N 1/00795* (2013.01); *H04N 1/04* (2013.01); *H05K 1/00* (2013.01); *H04N 2201/0049* (2013.01); *H04N 2201/0081* (2013.01)

(58) Field of Classification Search
CPC .... H04N 1/0083; H04N 1/04; H04N 1/00795; H01R 12/772; H01R 12/775; G03G 15/04; G03G 15/04036
USPC .................................................... 399/90, 211
See application file for complete search history.

(56) References Cited

U.S. PATENT DOCUMENTS

| 2003/0002889 A1* | 1/2003 | Kohchi | H04N 1/1013 399/211 |
| 2008/0068679 A1* | 3/2008 | Murai | H04N 1/00519 358/497 |
| 2012/0026558 A1* | 2/2012 | Fujiwara | H04N 1/0083 358/474 |
| 2012/0250057 A1* | 10/2012 | Miyanagi | G03G 15/60 358/1.13 |

FOREIGN PATENT DOCUMENTS

| JP | 2004-348074 A | 12/2004 |
| JP | 2009-182477 A | 8/2009 |
| JP | 2012-108424 A | 6/2012 |
| JP | 2014-138010 A | 7/2014 |

\* cited by examiner

*Primary Examiner* — Sandra Brase
(74) *Attorney, Agent, or Firm* — Buchanan Ingersoll & Rooney PC

(57) ABSTRACT

An image reading device which reads an image to obtain an image signal includes: a scanning unit; a chassis member; a control unit provided in a position which does not move together with the scanning unit; and a flexible flat cable which connects the scanning unit to the control unit, includes one end attached to a side of the chassis member and a position other than the one end fixed to a position which does not move with the scanning unit, includes a range closer to the one end than the fixed position parallel to a moving direction of the scanning unit, and is arranged to extend from the one end to one side, be bent into a U-shape, enter between the scanning unit and the chassis member, and reach the fixed position, and the flexible flat cable includes a transmitting layer, a shielding layer, and a stress adjusting layer.

10 Claims, 11 Drawing Sheets

IMAGE READING DEVICE

The entire disclosure of Japanese Patent Application No. 2015-089403 filed on Apr. 24, 2015 including description, claims, drawings, and abstract are incorporated herein by reference in its entirety.

BACKGROUND OF THE INVENTION

Field of the invention

The present invention relates to an image reading device which reads an image of an original to obtain an image signal. In more detail, the present invention relates to the image reading device which performs place-and-image reading of the image of the original which is statically placed by a scanning unit moving in a longitudinal direction of the original.

Description of the Related Art

JP 2012-108424 A discloses an example of this type of conventional image reading device. In the image reading device disclosed in JP 2012-108424 A, a reading unit elongated. in a main scanning direction reciprocates in a sub scanning direction to read the image of the original. Herein, communication of an electrical signal between the reading unit being a moving body and a housing which does not move is performed by a flexible flat cable (hereinafter, referred to as "FFC"). Furthermore, a protective film is arranged between the FFC and an original platen.

However, the above-described conventional technology has a following problem. That is to say, the FFC has a short life time. This is because the FFC is arranged in a bent manner and a direction of the bend is reversed in a part of the FFC due to the movement of the reading unit.

This is described with reference to FIGS. 1 and 2. FIG. 1 is a cross-sectional view of a reading unit 100 of this type. Although it is not illustrated in detail in this drawing, a direction. perpendicular to a paper face is a longitudinal direction (main scanning direction) of the reading unit 100. A horizontal direction indicated by arrow X in the drawing is a direction in which the reading unit 100 moves. Although it is not illustrated, the original to be read is placed above the reading unit 100 in the drawing such that a surface to be read faces downward. A FFC 102 is connected to the reading unit 100. The FFC 102 is arranged in a state bent into a U-shape between the reading unit 100 and a housing 101. FIG. 1 illustrates a situation in which the reading unit 100 is located in a leftmost position in a range of movement thereof. In this state, a portion in a range B in the drawing of the FFC 102 is bent into the U-shape. The FFC 102 in a bent section is bent to be convex with respect to the reading unit 100 and the housing 101.

A cross-sectional view in a state in which the reading unit 100 is moved rightward from the state illustrated in FIG. 1 is illustrated in FIG. 2. In FIG. 2, as compared to FIG. 1, the reading unit 100 is displaced rightward. According to this, the FFC 102 is widely bent into the U-shape where this protrudes leftward in the drawing from the reading unit 100. Herein, when the FFC 102 in FIG. 2 is examined in detail, it is understood that this is bent in a direction opposite to that in the description above in a portion in a range C. That is to say, the FFC 102 in the range C is bent to be convex with respect to the reading unit 100. Of course, the FFC 102 in the range C is bent to be convex when the reading unit 100 is located on a left end as in FIG. 1. Therefore, in this range, the direction of the bend of the FFC 102 is reversed by the movement of the reading unit 100. The FFC 102 fatigues to cause disconnection because the bend is repetitively reversed.

Especially, when the FFC 102 in which a shielding layer or an impedance adjusting layer is stacked on one surface side of a transmitting layer thereof is used, this problem is significant. Such FFC has a structure asymmetrical in a thickness direction, so that the transmitting layer is located in a position displaced from the center in the thickness direction. Therefore, it is changed between a state in which the transmitting layer is compressed in a longitudinal direction and a state in which this is extended in the longitudinal direction each time the bend is reversed.

SUMMARY OF THE INVENTION

The present invention has been made in order to solve the problem of the conventional technology described above. That is to say, an object thereof is to provide an image reading device configured to communicate a signal with a scanning unit by a FFC including a long-life FFC.

To achieve the abovementioned object, according to an aspect, an image reading device configured to read an image of an original to obtain an image signal, the image reading device reflecting one aspect of the present invention comprises: a scanning unit provided across an entire width direction of the original so as to be opposed to a placing surface on which the original is placed, the scanning unit which emits light to the original and receives light reflected by the original while moving in a longitudinal direction of the original; a chassis member located on a side opposite to the placing surface across the scanning unit; a control unit provided in a position which does not move together with movement of the scanning unit on the chassis member; and a FFC which connects the scanning unit to the control unit. Further, the FFC includes one end attached to a portion on a side of the chassis member in the scanning unit and a position other than the one end as a fixed position fixed to a position which does not move together with the movement of the scanning unit on the chassis member, includes a range closer to the one end than the fixed position parallel to a moving direction of the scanning unit, and is arranged so as to extend from the one end to one side in the moving direction of the scanning unit to be bent into a U-shape, enter between the scanning unit and the chassis member, and reach the fixed position. Furthermore, the FFC comprises a transmitting layer which transmits an electric signal between the scanning unit and the control unit, a shielding layer or an impedance adjusting layer provided on one surface side of the transmitting layer, and a stress adjusting layer provided on a side opposite to the shielding layer or the impedance adjusting layer across the transmitting layer.

In the image reading device in the above-described aspect, a part of the FFC is bent into the U-shape and a reversely bent portion is generated depending on a position of the scanning unit. Therefore, a part of the FFC is repetitively reversed between a bend and a reverse bend by reading operation. However, since the stress adjusting layer is provided on the FFC, a position of the transmitting layer in a thickness direction structure of the FFC is brought closer to the center. Therefore, stress applied to the transmitting layer is small even when the bend of the FFC is repetitively reversed. Therefore, the FFC has a long life.

In the image reading device in the above-described aspect, the shielding layer or the impedance adjusting layer is preferably provided on a surface on an outer side of the U-shaped bend of the FFC. This is advantageous for preventing noise from leaking.

In the image reading device in the above-described aspect, a bending neutral plane in an entire thickness of the FFC including the stress adjusting layer, the shielding layer, or the impedance adjusting layer is preferably located in the transmitting layer. By realizing this by adjusting a thickness of the stress adjusting layer, the stress of the bend applied to the transmitting layer may be more certainly decreased.

In the image reading device in the above-described aspect, the stress adjusting layer is preferably at least provided in a section which is possibly bent in a direction. opposite to the U-shaped bend when the scanning unit is moved, the section in a longitudinal direction of the FFC. This is because this "section" is an area in which the bend is reversed of the FFC. Providing the stress adjusting layer so as to cover this section is advantageous for realizing the long-life FFC.

The section in which the stress adjusting layer is provided is preferably slightly enlarged such that the layer is at least provided across an entire section which possibly float from a chassis member when the scanning unit is moved, the section in the longitudinal direction of the FFC. In this manner, the stress adjusting layer is not easily peeled from an end in a longitudinal direction thereof.

As for the section in which the stress adjusting layer is provided, there can be a section in which it is preferable not to provide the stress adjusting layer. That is to say, the FFC is preferably bent such that the longitudinal direction of the FFC is changed at the fixed position. In this case, the stress adjusting layer is not preferably formed in a section including the fixed position in the longitudinal direction of the FFC.

In the image reading device in the above-described aspect, the image reading device further preferably includes an elastic sheet member including one end attached to the scanning unit, the elastic sheet member which presses the FFC toward the chassis member by a portion other than the one end. This is because, when the FFC is about to be reversely bent, the reverse bend of the FFC is inhibited by elasticity of the elastic sheet member.

In the image reading device including the elastic sheet member in the above-described aspect, the scanning unit preferably includes a rear surface steeply rising in a direction away from the chassis member on a side toward which the FCC extends from a position to which the one end of the FFC is attached, the one end of the elastic sheet member is preferably attached to the rear surface of the scanning unit, and the elastic sheet member is preferably arranged so as to be bent by the FFC such that a surface on a side attached to the rear surface is convex and so as to press the FFC toward the chassis member by reactive force of the bend. This is because the reverse bend of the FFC may be more effectively inhibited by the arrangement of the elastic sheet member.

In the image reading device including the elastic sheet member in the above-described aspect, the elastic sheet member preferably includes a slit through which the FFC passes formed, presses the FFC between the one end and the slit, and includes a section between the slit and the other end entering an inner side of the U-shaped bend of the FFC. In this manner, the vicinity of a tip end of the elastic sheet member is always regulated by an inner surface of the U-shaped bend of the FFC. Therefore, the tip end of the elastic sheet member does not get stuck in another portion even when the scanning unit is reciprocated.

In the image reading device in the above-described aspects, the image reading device further preferably includes a photoelectric conversion device mounted on the scanning unit to output the image signal according to the light reflected by the original, the FFC preferably includes both the shielding layer and the impedance adjusting layer, and the image signal output by the photoelectric conversion device is preferably included in a signal transmitted from the scanning unit to the control unit by the FFC. In this case, the FFC transmits the image signal output by the photoelectric conversion device at a significantly high frequency. Therefore, the shielding layer and the impedance adjusting layer are highly needed. Therefore, necessity of relaxing asymmetry of a cross-sectional structure of the FFC by the stress adjusting layer is higher.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein.

DESCRIPTION OF THE PREFERRED EMBODIMENTS

Figure 1:
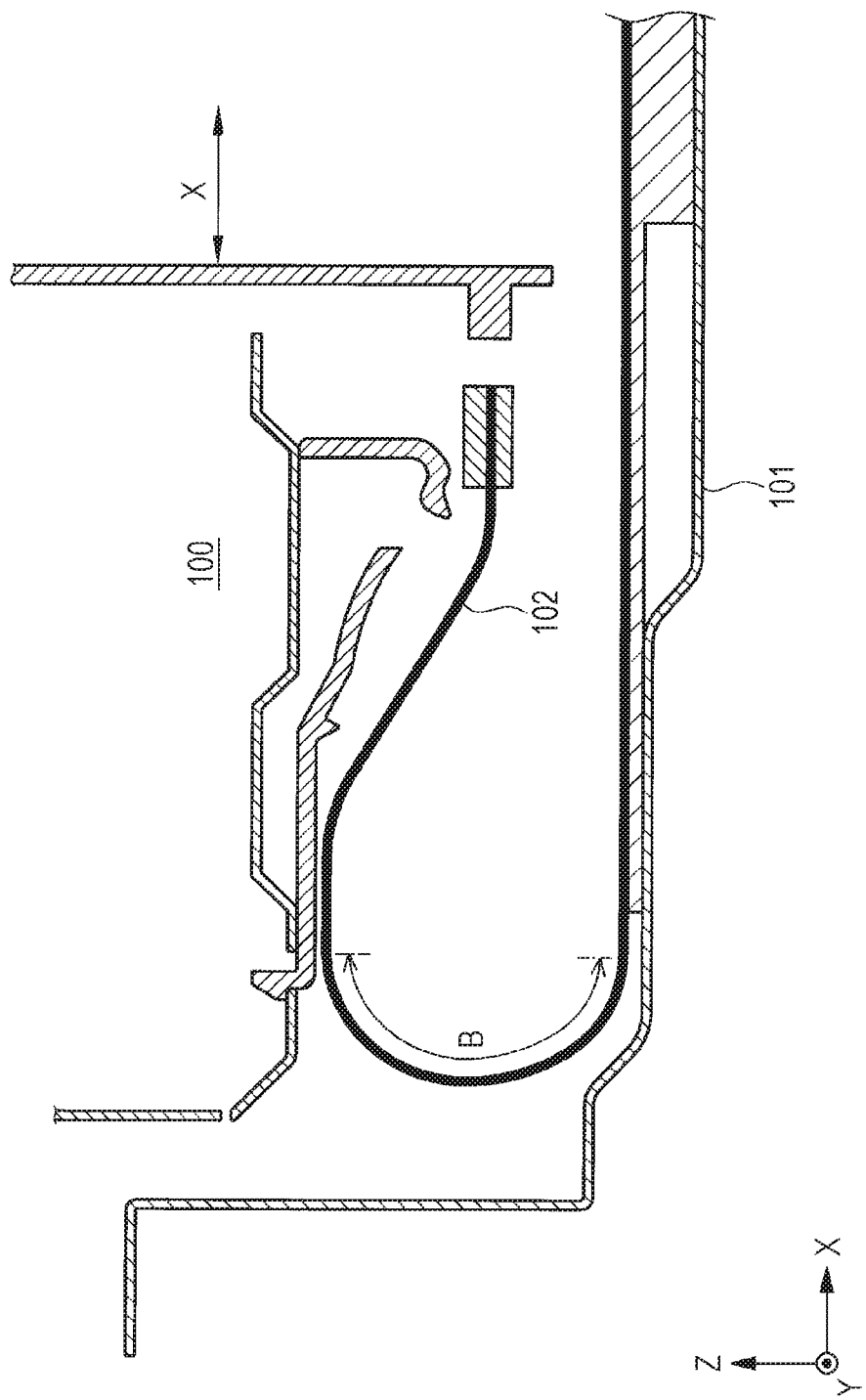
FIG. 1 is a cross-sectional view illustrating an example of a reading unit.

Hereinafter, an embodiment which embodies the present invention will be described in detail with reference to the drawings. However, the scope of the invention is not limited to the illustrated examples. This embodiment is obtained by applying the present invention to an image reading device 1 illustrated in FIG. 3. The image reading device 1 includes a housing 10. The housing 10 is a container-shaped member in a substantially rectangular shape as a whole whose top is opened. A short side direction Y of a rectangle of the housing corresponds to a width direction of an original to be read and a long side direction X thereof corresponds to a longitudinal direction of the original. However, the width direction and longitudinal direction of the original are herei conveniently referred to, so that a width direction dimension may be longer than a longitudinal direction dimension.

A scanning unit 11 is an elongated member provided across an entire maximum width direction dimension of the original. An LED light-emitting device 12, reflecting mirrors 13 and 14, and a CCD light--receiving device 15 are arranged in the scanning unit 11 as illustrated in a schematic cross-sectional view in FIG. 4. That is to say, the CCD light-receiving device 15 is mounted on the scanning unit 11 in this embodiment. A slit 16 is formed on a top surface of the scanning unit 11. Meanwhile, the short side direction Y in FIG. 3 corresponds to a direction perpendicular to a paper face in FIG. 4.

With reference to FIG. 3 again, the housing 10 is provided with rails 17 and 18 parallel to the long side direction X. The scanning unit 11 is provided so as to be slidable with respect to the rails 17 and 18. That is to say, the scanning unit 11 is movable in the long side direction X. The housing 10 is further provided with a motor 19 and a belt 20. According to this, the scanning unit 11 is driven in the long side direction X. A FFC 22 is arranged on a bottom surface 21 (chassis member) of the housing 10. A control board 23 is provided outside the housing 10. The FFC 22 connects the scanning unit 11 to the control board 23.

Figure 4:
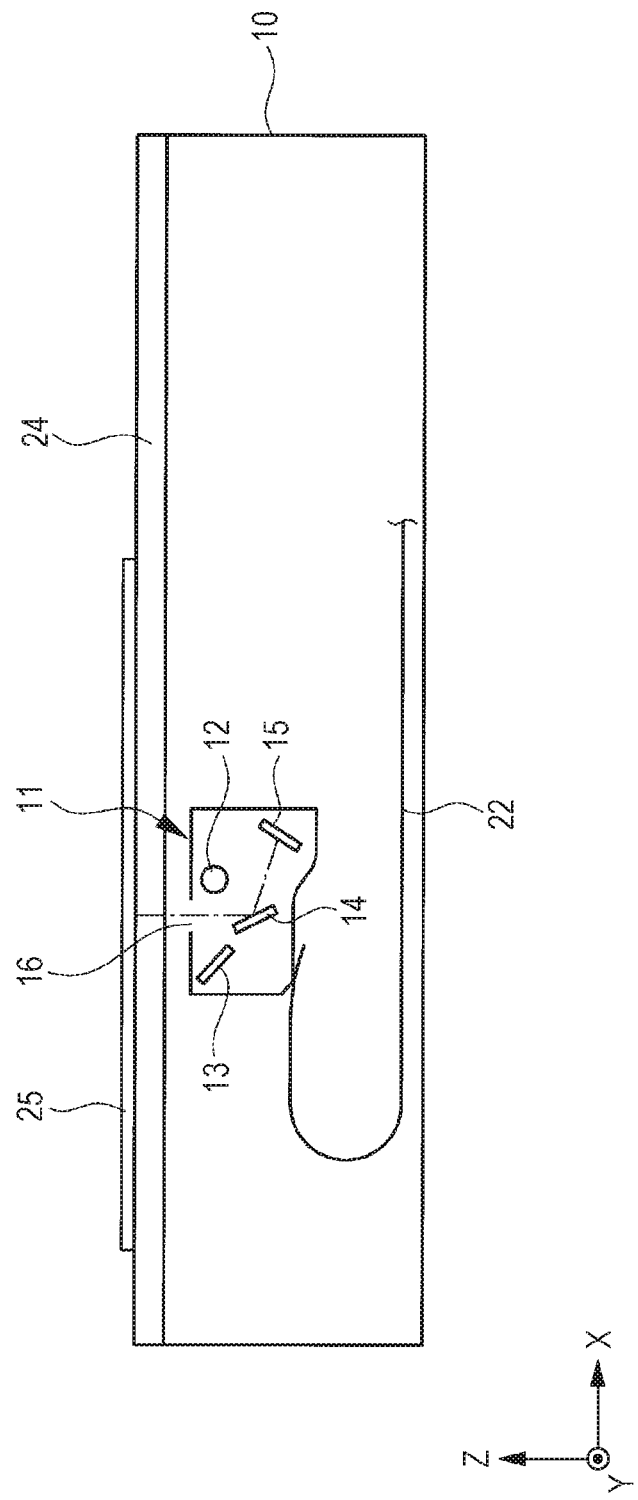
FIG. 4 is a cross-sectional schematic diagram illustrating positional relationship between a scanning unit and an original.

The above-described image reading device 1 is mounted on a reading unit of a copier. Alternatively, this is mounted on a scanner. In a state in which the image reading device I is mounted on such device, an original platen glass 24 is located above the scanning unit. 11 as illustrated in FIG. 4. A surface facing downward in FIG. 4 of an original 25 placed on the original platen glass 24 is a surface to be read. That is to say, the CCD light-receiving device 15 outputs an image signal based on light emitted from the LED light-emitting device 12 to be reflected by the surface to be read of the original 25. The image signal is transmitted from the scanning unit 11 to the control board 23 through the FFC 22, of course. In contrast, a signal which operates a light emitting situation of the LED light-emitting device 12 is transmitted from the control board 23 to the scanning unit 11 through the FFC 22.

Figure 3:
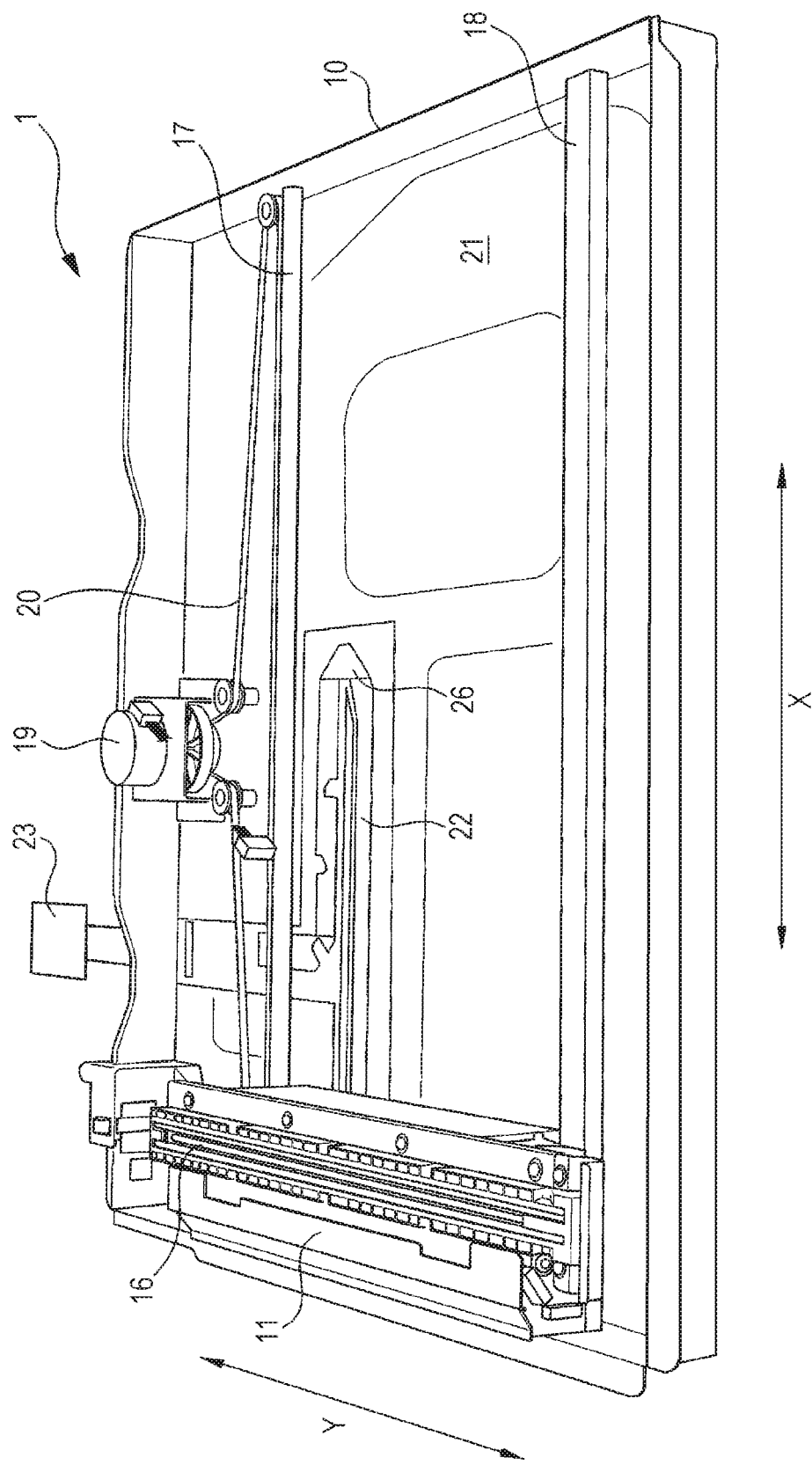
FIG. 3 is a perspective view of an image reading device according to an embodiment.

As illustrated in FIG. 3, there is a bent portion 26 in the middle of the FFC 22. At the bent portion 26, the FFC 22 is obliquely bent and a longitudinal direction thereof is changed. At the bent portion 26 in FIG. 3, the longitudinal direction of the FFC 22 is changed by 90 degrees. Although there are three bent portions in FIG. 3, a configuration with only one bent portion is also possible. At the bent portion 26, the FFC 22 is fixed to the bottom surface 21. The FFC 22 in a section between the bent portion 26 and the scanning unit 11 is arranged such that the longitudinal direction thereof is parallel to the long side direction X. Although a portion closer to the scanning unit 11 than the bent portion 26 of the FFC 22 is arranged to hug on the bottom surface 21, this is not fixed to the bottom surface 21.

Figure 5:
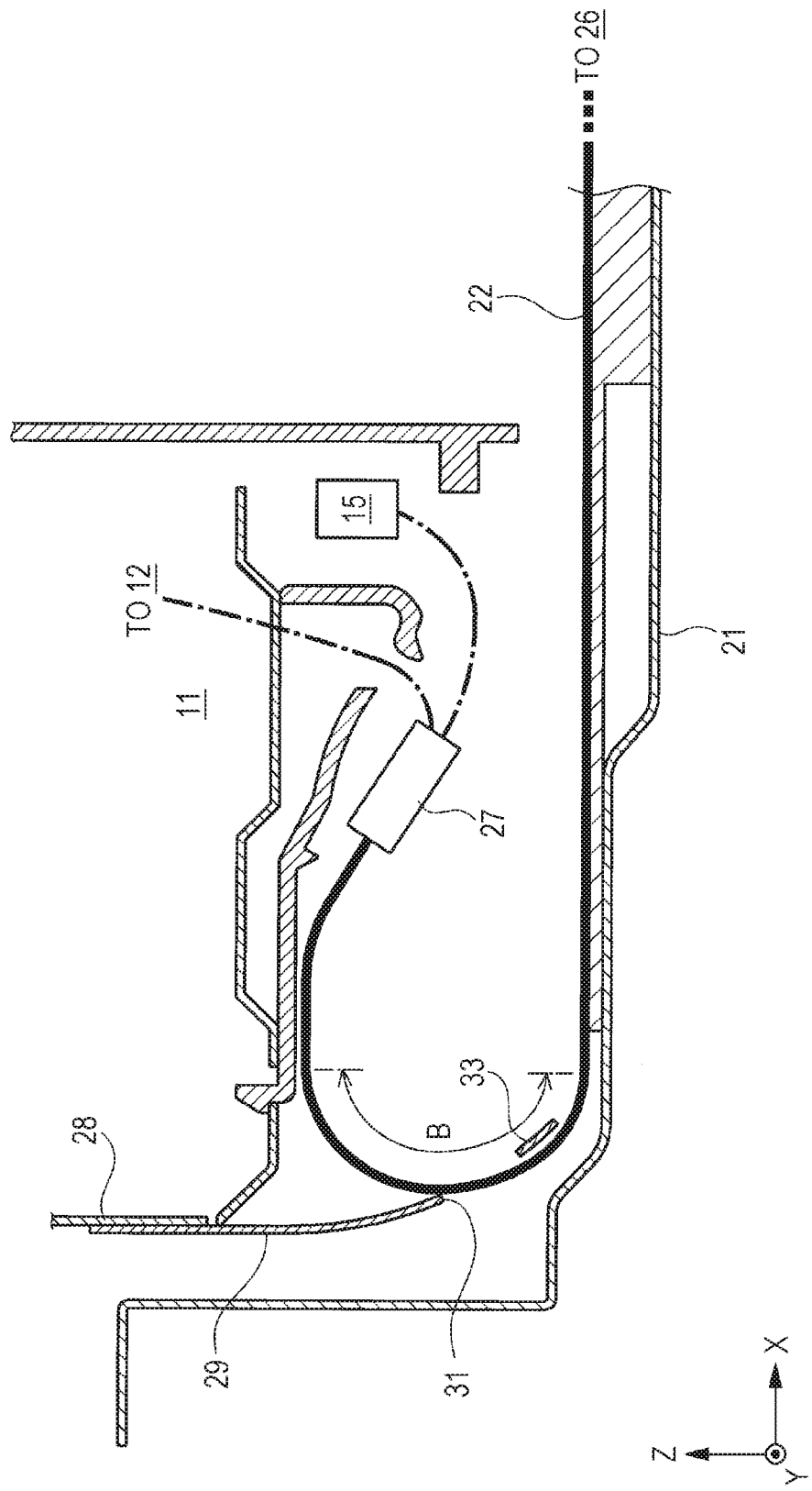
FIG. 5 is an enlarged cross-sectional view illustrating a situation on a lower portion of the scanning unit.

A situation of the FTC 22 in a portion between the scanning unit 11 and the bottom surface 21 is illustrated in an enlarged cross-sectional view in FIG. 5. In FIG. 5, an upper portion and inner components of the scanning unit 11 are not illustrated. As illustrated in FIG. 5, one end of the FTC 22 is attached to a connector 27 provided on a lower portion of the scanning unit 11, that is to say, a part on a side of the bottom surface 21. The FFC 22 may be removably inserted to the connector 27. The connector 27 is connected to the LED light-emitting device 12 and the CCD light-receiving device 15. Meanwhile, FIG. 5 illustrates a situation in which the scanning unit 11 is located in a leftmost position in a range of movement thereof as in FIG. 1 above.

The FFC 22 is arranged to extend leftward in the long side direction X (although this extends slightly obliquely upward in FIG. 5, this extends leftward in the long side direction X as seen from above) from the connector 27 to be bent into a U-shape in a range B, passes between the scanning unit 11 and the bottom surface 21 to hug on the bottom surface 21, and extends toward the above-described bent portion 26.

Figure 6:
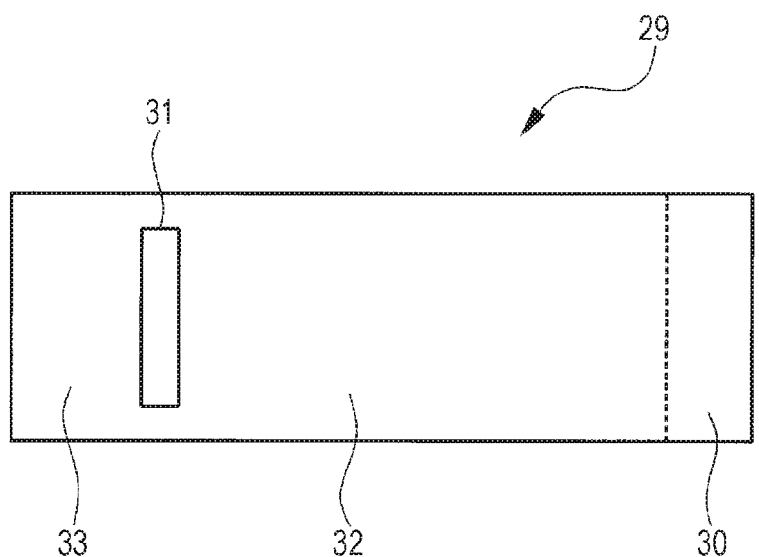
FIG. 6 is a plane view illustrating an elastic sheet member.

Furthermore, a rear surface 28 is formed on a part of the scanning unit 11. The rear surface 28 is a steep surface rising in a direction away from the bottom surface 21 on a side toward which the FFC 22 extends from the connector 27 of the scanning unit 11. An elastic sheet member 29 is attached to an outer surface of the rear surface 28. The elastic sheet member 29 is an elastic resin film (for example, supplied under a trade name "Mylar"), a reed-shaped sheet as illustrated in FIG. 6. One end of the elastic sheet member 29 serves as an adhering portion 30 to the rear surface 28. A slit 31 is formed in the vicinity of an end on a side opposite to the adhering portion 30 of the elastic sheet member 29. According to this, the elastic sheet member 29 is divided into a middle part 32 and a tip end 33. The slit 31 has a shape such that the FFC 22 passes therethrough. Therefore, in FIG. 5, the tip end 33 of the elastic sheet member 29 is located on an inner side of a bent shape of the FFC 22.

Figure 2:
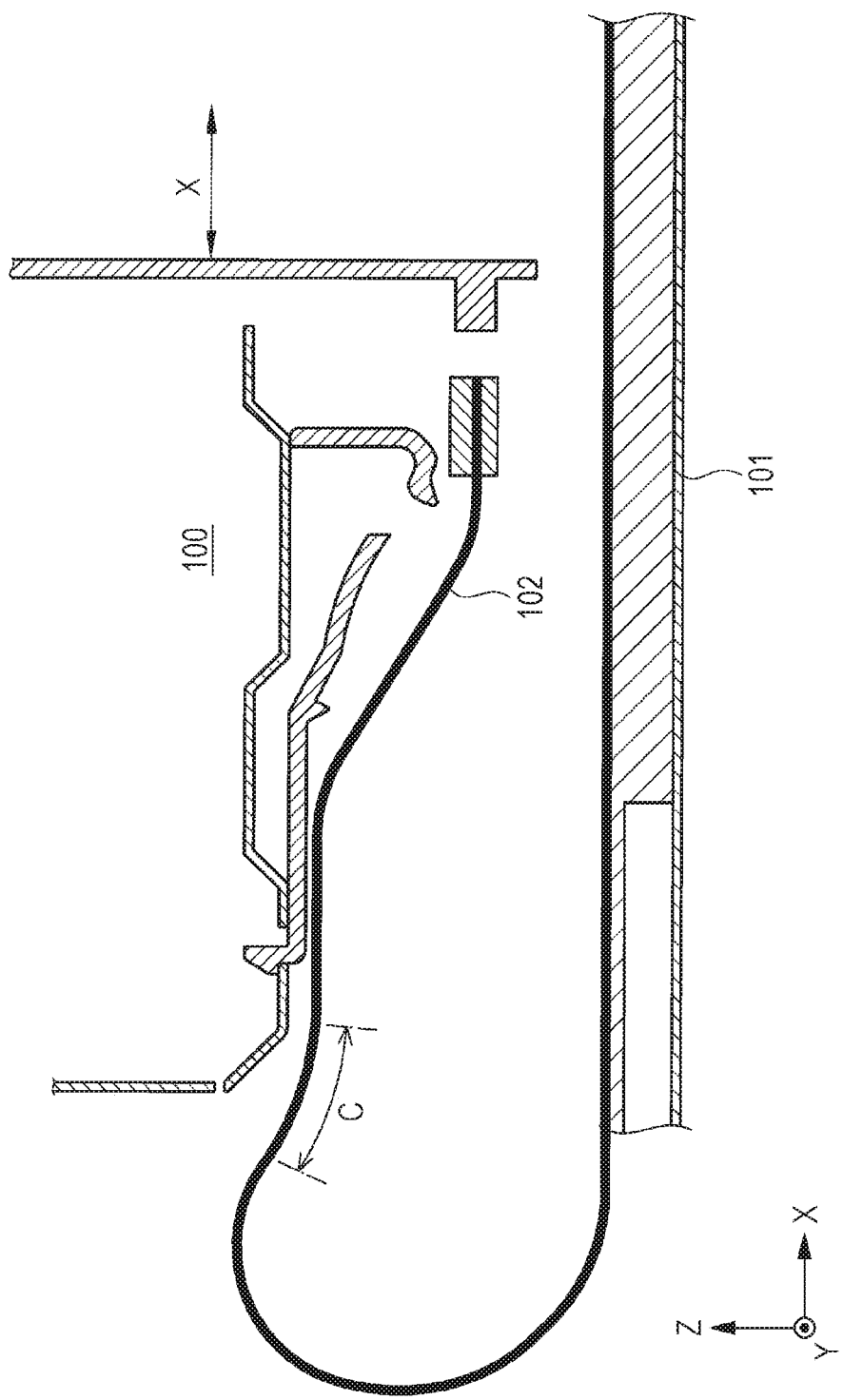
FIG. 2 is a cross-sectional view illustrating a situation in which the reading unit in FIG. 1 is moved.
Figure 7:
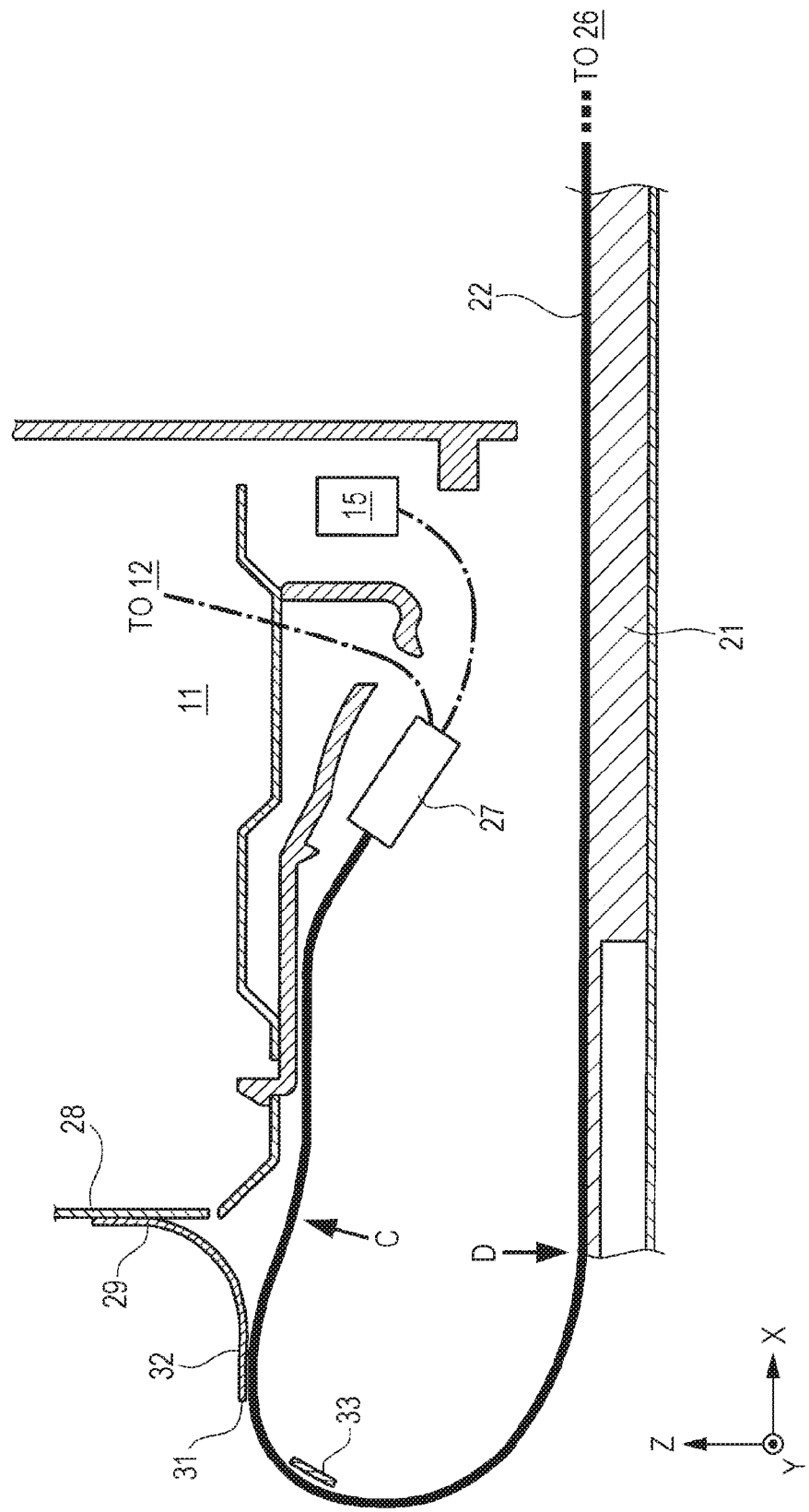
FIG. 7 is a cross-sectional view illustrating a situation in which the scanning unit in FIG. 5 is moved.

When the above-described scanning unit 11 is moved rightward from the position illustrated in FIG. 5, a state illustrated in FIG. 7 is realized. FIG. 7 illustrates a state corresponding to FIG. 2 above. Of course, FIG. 7 is different from FIG. 2 mainly in presence of the elastic sheet member 29. In FIG. 7, a reverse bend of a portion illustrated as a range C in FIG. 2 is relaxed by the presence of the elastic sheet member 29. This point is described. In FIG. 7, as compared with FIG. 5, the FFC 22 widely protrudes leftward from the scanning unit 11 to be bent into the U-shape there by the movement rightward of the scanning unit 11. Therefore, the elastic sheet member 29 is bent. That is to say, the elastic sheet member 29 in FIG. 7 is bent such that a surface on a side adhered to the rear surface 28 is convex. By reactive force of the bend, the elastic sheet member 29 presses the FFC 22 toward the bottom surface 21 by the middle part 32 thereof. According to this, in FIG. 7, the reverse bend of the FFC 22 as illustrated in FIG. 2 is relaxed.

Meanwhile, in FIG. 7, as compared with FIG. 5, a larger part of the FFC 22 floats from the bottom surface 21. That is to say, a portion closer to the connector 27 than a position indicated by arrow D in FIG. 7 floats from the bottom surface 21. The FFC 22 in a portion closer to the bent portion 26 than the position indicated by arrow D hugs on the bottom. surface 21. As the scanning unit 11 moves rightward, the position indicated by arrow D moves rightward.

When the scanning unit 11 is moved leftward from the state in FIG. 7, this returns to the state in FIG. 5 by itself. That is to say, the tip end 33 of the elastic sheet member 29 does not get stuck in another portion. This is, of course, because the tip end 33 enters an inner surface side of the FFC 22 by the slit 31.

Figure 8:
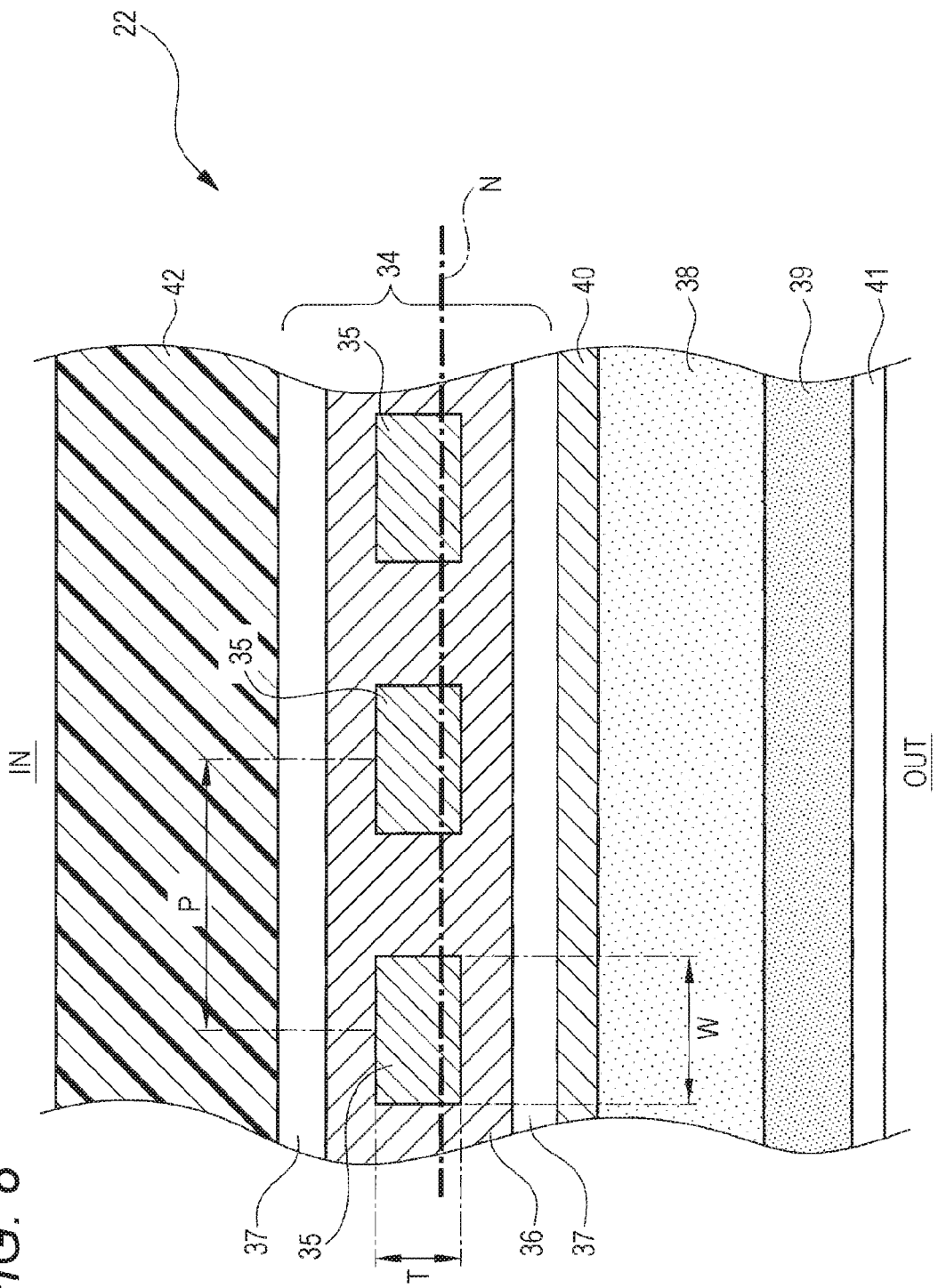
FIG. 8 is a cross-sectional view in a width direction of a FFC used in the embodiment.

Furthermore, the FFC 22 itself is actually different from a FFC 102 illustrated in FIGS. 1 and 2. A cross-sectional view in a width direction of the FFC 22 used in the image reading device 1 of this embodiment is illustrated in FIG. 8. As illustrated in FIG. 8, the FFC 22 has a multi-layer structure. A transmitting unit 34 is located substantially the center in a thickness direction of the FFC. A larger number of conductive wires 35 are arranged at intervals in the width direction of the FFC 22 in the transmitting unit 34. The transmitting unit 34 includes filled resin 36 which insulates the conductive wires 35 from one another. Both surfaces of the transmitting unit 34 are covered with coating layers 37. The transmitting unit 34 is an essential FFC. In this example, a thickness T, a width W, and a pitch P of the conductive wire 35 are approximately 35 µm, 320 µm, and 500 µm, respectively.

The FFC 22 includes an impedance adjusting layer 38 and a shielding layer 39 on one surface side thereof (outer side of the U-shaped bend). The impedance adjusting layer 38 is a layer for adjusting impedance of the FFC 22, the layer for highly efficiently transmitting a high BPS signal (approximately 1 to 2 GBPS) such as the image signal output from the CCD light-receiving device 15. The shielding layer 39 is a layer for preventing noise from leaking out of the FFC 22. The impedance adjusting layer 38 and the shielding layer 39 themselves are well-known. In this example, a bonding layer 40 is provided between the impedance adjusting layer 38 and the transmitting unit 34, and a coating layer 41 is provided on a surface of the shielding layer 39.

In contrast, a PET layer 42 is provided on the other surface side of the transmitting unit 34 (inner side of the U-shaped bend). The PET layer 42 being a simple layer formed of PET resin is the layer for adjusting a position of a bending neutral plane in an entire FFC 22. That is to say, a bending neutral plane N is located within a range of the conductive wire 35 due to presence of the PET layer 42. In this manner, even when the FFC 22 is bent, large stress (tensile stress or compression stress) is not applied to the conductive wire 35. Therefore, disconnection of the conductive wire 35 does not easily occur even when the bend is repetitively reversed, so that a long life is realized.

Figure 9:
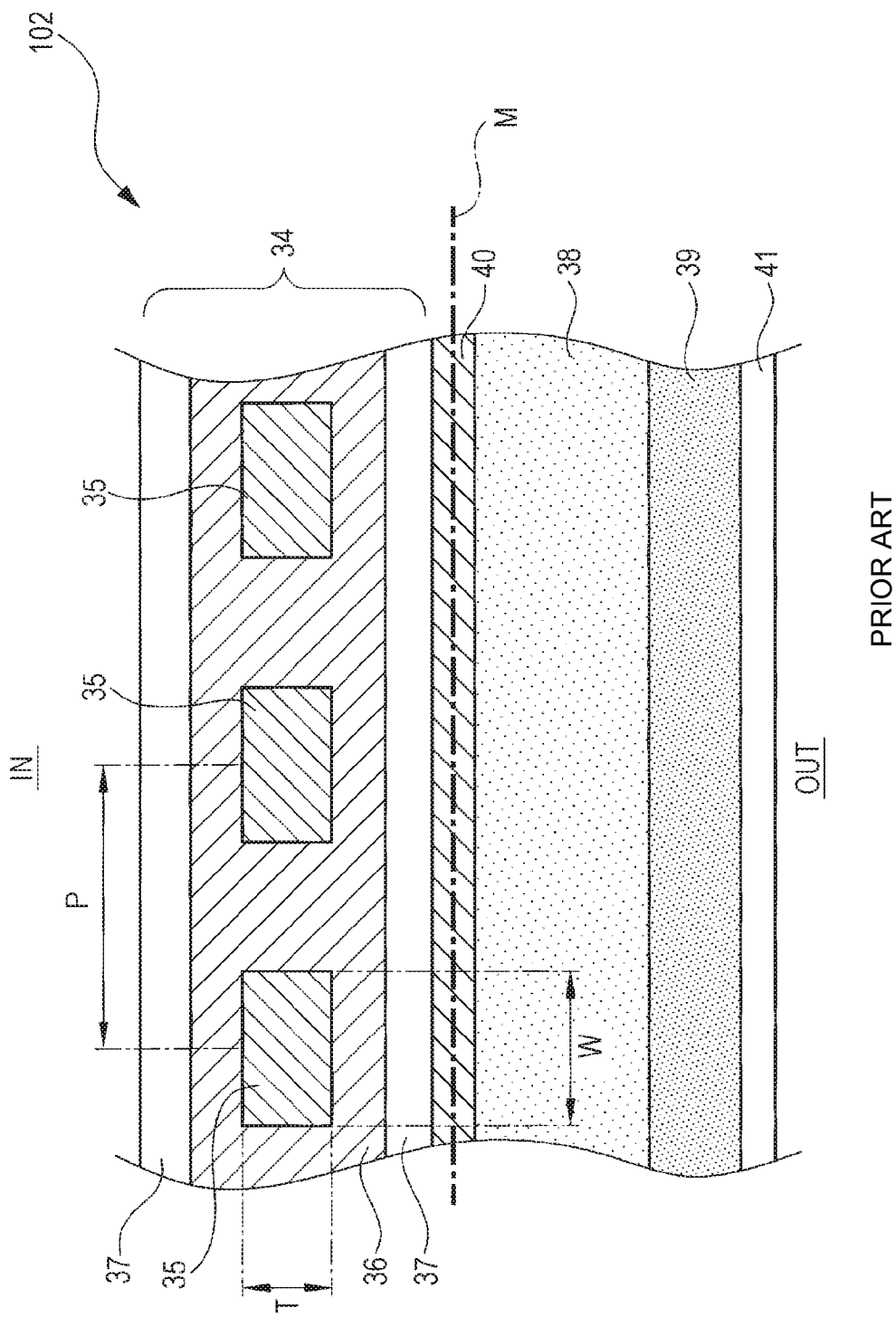
FIG. 9 is a cross-sectional view in a width direction of a conventional FFC.

Meanwhile, a cross-section of the conventional FFC 102 (FIGS. 1 and 2) has a structure illustrated in FIG. 9. This is different from that in FIG. 8 in absence of the PET layer 42. Therefore, a bending neutral plane M in an entire FFC 102 is located in a position completely displaced from the conductive wire 35. Therefore, the stress is easily applied to the conductive wire 35 at the time of bending.

Meanwhile, in this embodiment, the above-described PET layer 42 is not necessarily provided across an entire area in the longitudinal direction of the FFC 22. This point is described. The PET layer 42 is most required to be provided on an area in which the bend is reversed as is clear from the description above. That is to say, this is the area which may be put into a reversely bent state illustrated as the range C in FIG. 2. Furthermore, a portion which is put into the reversely bent state once when the scanning unit 11 is moved across an entire range of movement thereof should be referred to as an area in which the bend is reversed. Therefore, it is desirable to provide the PET layer 42 so as to cover an entire such area. Roughly speaking, the PET layer 42 provided so as to cover a 35% section closer to the connector for 27 out of the section from the connector 27 to the bent portion 26 of the FFC 22 may satisfy this. However, a portion always located below the scanning unit 11 out of the range may be excluded.

Furthermore, it is also possible to provide the PET layer 42 so as to be elongated toward the bent portion 26 a little more than the above. Specifically, the PET layer 42 is more preferably provided so as to cover to a position which is put into a state indicated by arrow D in FIG. 7 in a state in which the scanning unit 11 is moved to a rightmost part in FIG. 5. When the PET layer 42 is provided in this manner, an end on a side of the bent portion 26 of the PET layer 42 does not float from the bottom surface 21 even when the scanning unit 11 is moved across the entire range of movement thereof. Therefore, the PET layer 12 is not peeled from the end on the side of the bent portion 26 by long-term use. Roughly speaking, the PET layer 42 provided so as to cover a 65% section closer to the connector 27 out of the section from the connector 27 to the bent portion 26 of the FFC 22 (however, a portion always located below the scanning unit 11 is excluded) may satisfy this.

On the other hand, there also is a section in which it is preferable not to provide the PET layer 42. It is preferable not to provide the PET layer 42 on the bent portion 26 itself. When the PET layer 42 is provided on the FFC 22, this portion is not easily bent. Meanwhile, a deforming situation of the bent portion 26 itself is not changed once the portion is formed as the bent portion 26, so that it is not required to consider about repetitive deformation. The PET layer 42 is not necessarily provided also in a section from the bent portion to the control board 23 except when the section especially has a configuration arranged to be movable. However, provision of the PET layer 42 in this section is not prohibited.

Subsequently, a result of a verification test of an effect obtained by providing the PET layer 42 is described. In this test, the transmitting unit 34 with a thickness of approximately 130 μm including the filled resin 36 (PET/HM) with relative permittivity of approximately 3.0 was used. There were two patterns of the impedance adjusting layer 38 and the shielding layer 39 as follows,

FIRST EXAMPLE

Impedance adjusting layer 38: thickness of approximately 120 μm, relative permittivity of approximately 2.1
Shielding layer 39: thickness of approximately 29 μm, silver deposition SN/HM type

SECOND EXAMPLE

Impedance adjusting layer 38: thickness of approximately 110 μm, relative permittivity of approximately 2.3
Shielding layer 39: thickness of approximately 45 μm, aluminum solid shield (conductive adhesive material)

The PET layer 42 having a thickness of 50 pm was used; the PET layer 42 was provided on an entire area closer to the connector 27 than the bent portion 26. However, the PET layer 42 was not provided on the bent portion 26 itself. In configurations of the test examples, when the position of the bending neutral plane was checked by CAE analysis, this was located within the range of the conductive wire 35 in both cases. In both of them, 14,000,000 sheets or more were able to be read. Disconnection occurred in the transmitting unit 34 when *approximately* 140,000 *sheets* were read without the PET layer 42 and the elastic sheet member 29 used (comparative example), so that improvement by two orders of magnitude was realized. Normal request specification is approximately 380,000 sheets, so that this was sufficiently cleared.

Figure 10A:
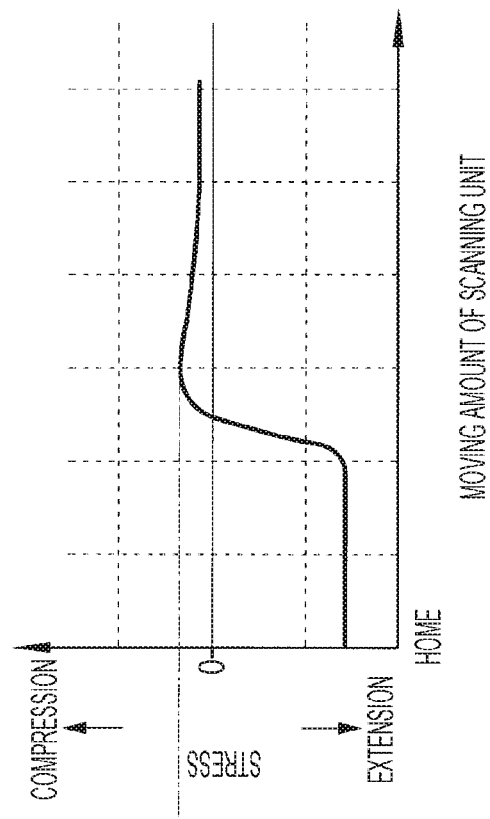
FIGS. 10A and 10B are graphs indicating decrease in maximum stress applied to the FFC.
Figure 10B:
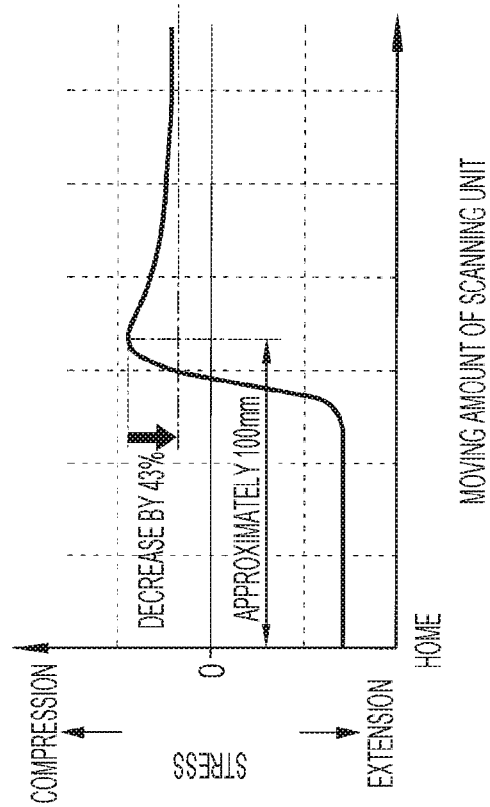

FIGS. 10A and 10B are graphs indicating a result. of a test to compare maximum stress applied to the FFC 22 between the comparative example and an example. In the comparative example, neither the PET layer 42 nor the elastic sheet member 29 was used. In the example, both the PET layer 42 and the elastic sheet member 29 were used. In both cases, the impedance adjusting layer 38 and the shielding layer 39 were as those of the above-described first example.

In the test in FIGS. 10A and 10B, the scanning unit 11 was moved in a state in which a strain gauge was mounted on the FFC 22 and transition of a stress value by a movement amount was graphed. The stress value was according to the strain gauge. "Home" in the graph is about a horizontal axis and this is intended to mean that the scanning unit 11 is located in a position the farthest from the bent portion 26 (state illustrated in FIG. 5). When the scanning unit 11 was moved rightward in FIG. 5, the stress was reversed from extension stress to the compression stress at a certain point.

This is considered because the portion of the strain gauge enters the above-described reversely bent range. Then, the compression stress value indicated a peak. Thereafter, the compression stress value gradually decreased. The peak of the compression stress value of the example was approximately 43% of that of the comparative example, so that this decreased to less than half.

Figure 11:
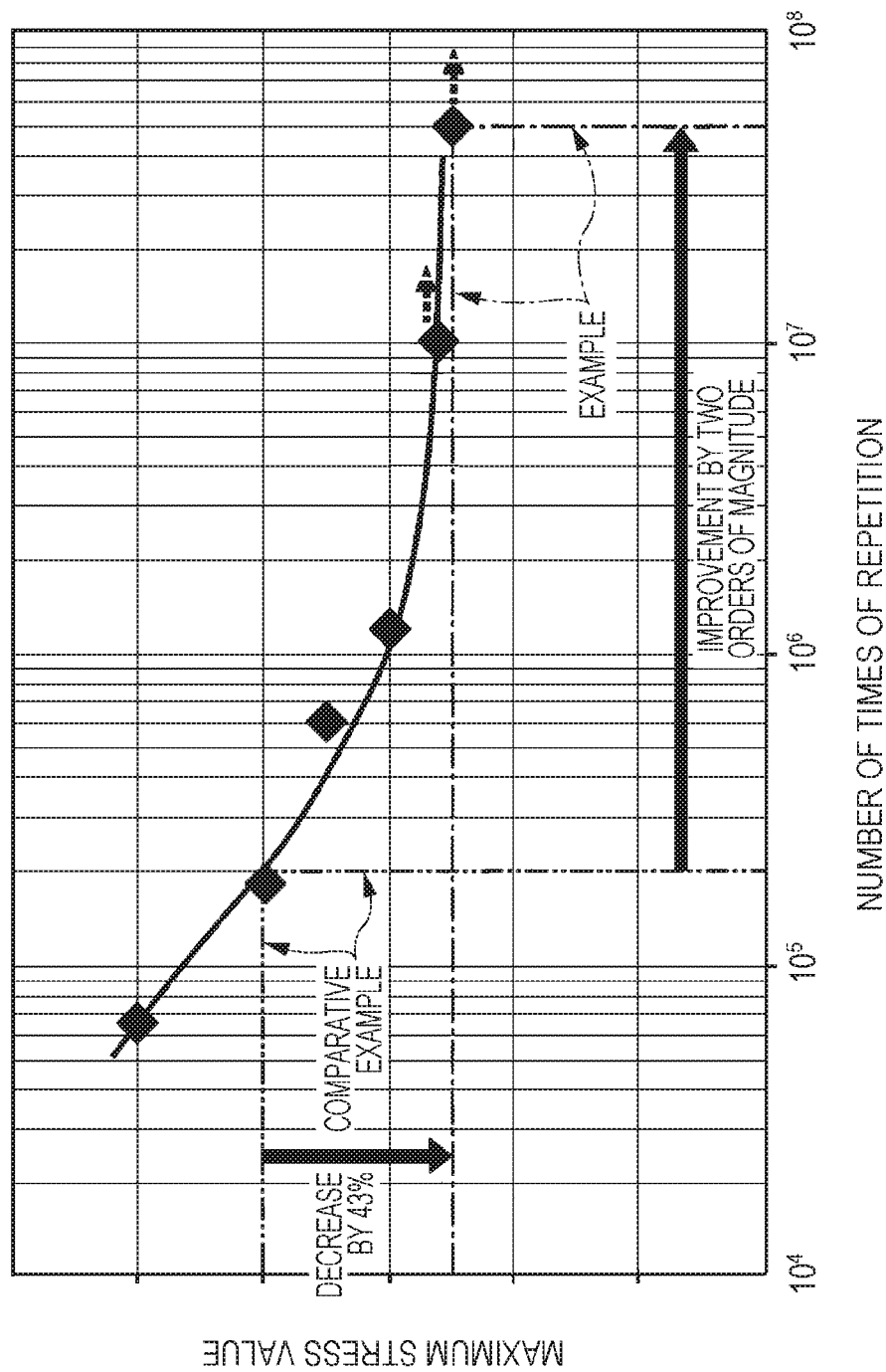
FIG. 11 is a graph indicating relationship between the maximum stress applied to the FFC and durability.

The number of times of repetitive reverse of stress until the disconnection occurred were compared under conditions with which the above-described maximum stress value took various values. As a result, a graph in FIG. 11 was obtained. From this graph, it is understood that the number of times of repetition becomes larger as the maximum stress value is made smaller. The above-described comparative example and example are found on this tendency. According to this, it is possible to confirm that durability is improved by decreasing the stress applied to the FFC 22 by the bend.

As described, in detail above, according to this embodiment, measures are taken to decrease the stress generated by the reverse of the bend of the FFC 22 in the image reading device 1 which reads the image of the original placed thereon by moving the scanning unit 11. Specifically, the PET layer 42 is provided on a surface opposite to the impedance adjusting layer 38 and the shielding layer 39 of the FFC 22. According to this, the bending neutral plane N of the FFC 102 is brought closer to the conductive wire 35. Furthermore, the bending neutral plane N is located within the range of the conductive wire 35. The elastic sheet member 29 is provided on the scanning unit 11. According to this, the reverse bend itself of the FFC 22 is inhibited. According to this, the image reading device 1 of a type to read while bending the FFC 22 including the long-life FFC 22 is realized.

Meanwhile, this embodiment is merely an example and this does not limit the present invention at all. Therefore, the present invention may be variously improved or modified within the scope of the gist thereof. For example, a material of the PET layer 42 may be replaced with another resin other than PET. Although the thickness of the PET layer 42 is set such that the bending neutral plane N is located within the range of the conductive wire 35 in the above-described example, the thickness is not necessarily limited thereto. When bending neutral plane N is located within a range of the filled resin 36 or a range of the transmitting unit 34 slightly broader than the same also, a certain effect may be obtained. When the center of an entire thickness of the FFC 22 (including the impedance adjusting layer 38, the shielding layer 39, and the PET layer 42) is located within the range of the conductive wire 35 in place of paying attention to the bending neutral plane N also, a certain effect may be obtained.

A method of attaching the elastic sheet member 29 may also be modified. Although the elastic sheet member 29 is provided on the rear surface 28 of the scanning unit 11 as illustrated in FIG. 7 in the above-described example, it is also possible to attach the elastic sheet member 29 on a lower surface of the scanning unit 11. In this case, the elastic sheet member 29 is located so as to be interposed between the lower surface of the scanning unit 11 and the FFC 22 and the middle part 32 thereof is located on the outer side of the U-shaped bend of the FFC 22 as in the above-description. A role of the slit 31 is also similar to that in the above-description. In this case, when the FFC 22 is about to be reversely bent, the elastic sheet member 29 is also bent in the same direction. Therefore, the reverse bend is inhibited by the reactive force thereof. It is also possible to attach the elastic sheet member 29 on a lower surface of the connector 27. In this case, two slits are provided on the elastic sheet member 29 and the elastic sheet member 29 is arranged to go out of the FFC 22 and return to the inner side thereof at its tip end 33.

Furthermore, when it is configured to relax the stress of the FFC 22 only by the PET layer 42 without the elastic sheet member 29 included also, a certain effect may be obtained. The PET layer 42 may be arranged so as to be located on the outer side of the bend at the U-shaped bend of the FFC 22 contrary to the description above. However, the shielding layer 39 is preferably located on the outer side of the U-shaped bend in order to prevent the noise from leaking outside.

The FFC 22 including only one of the impedance adjusting layer 38 and the shielding layer 39 also has an effect of providing the PET layer 42 and the elastic sheet member 29. For example, when the CCD light-receiving device 15 is not mounted on the scanning unit 11 but is fixedly arranged on the housing 10, necessity of providing the impedance adjusting layer 38 on the FFC is not very high. This is because the image signal is not transmitted by the FFC. The present invention may also be applied to such a case.

According to an embodiment of the present invention, with this configuration, the image reading device having a configuration of communicating the signal with the scanning unit by the FFC, the device having the long-life FFC is provided.

Although the present invention has been described and illustrated in detail, it is clearly understood that the same is by way of illustrated and example only and is not to be taken by way of limitation, the scope of the present invention being interpreted by terms of the appended claims.

What is claimed is:

1. An image reading device configured to read an image of an original to obtain an image signal, the image reading device comprising:
   a scanning unit provided across an entire width direction of the original so as to be opposed to a placing surface on which the original is placed, the scanning unit which emits light to the original and receives light reflected by the original while moving in a longitudinal direction of the original;
   a chassis member located on a side opposite to the placing surface across the scanning unit;
   a control unit provided in a position which does not move together with movement, of the scanning unit on the chassis member; and
   a flexible flat cable which connects the scanning unit to the control unit, wherein
   the flexible flat cable includes
   one end attached to a portion on a side of the chassis member in the scanning unit and a position other than the one end as a fixed position fixed to a position which does not move together with the movement of the scanning unit on the chassis member,
   includes a range closer to the one end than the fixed position parallel to a moving direction of the scanning unit, and
   is arranged so as to extend from the one end to one side in the moving direction of the scanning unit to be bent into a U-shape, enter between the scanning unit and the chassis member, and reach the fixed position, and
   the flexible flat cable comprises
   a transmitting layer which transmits an electric signal between the scanning unit and the control unit,
   a shielding layer or an impedance adjusting layer provided on one surface side of the transmitting layer, and a stress adjusting layer provided on a side opposite to the shielding layer or the impedance adjusting layer across the transmitting layer.

2. The image reading device according to claim 1, wherein
the shielding layer or the impedance adjusting layer is provided on a surface on an outer side of the U-shaped bend of the flexible flat cable.

3. The image reading device according to claim 1, wherein
a bending neutral plane in an entire thickness of the flexible flat cable including the stress adjusting layer, the shielding layer, or the impedance adjusting layer is located in the transmitting layer.

4. The image reading device according to claim 1, wherein
the stress adjusting layer is at least provided in a section which is possibly bent in a direction opposite to the U-shaped bend when the scanning unit is moved, the section in a longitudinal direction of the flexible flat cable.

5. The image reading device according to claim 4, wherein
the stress adjusting layer is at least provided across an entire section which possibly floats from the chassis member when the scanning unit is moved, the section in the longitudinal direction of the flexible flat cable.

6. The image reading device according to claim 4, wherein
the flexible flat cable is bent such that the longitudinal direction of the flexible flat cable is changed at the fixed position, and
the stress adjusting layer is riot formed in a section including the fixed position in the longitudinal direction of the flexible flat cable.

7. The image reading device according to claim 1, comprising:
an elastic sheet member including one end attached to the scanning unit, the elastic sheet member which presses the flexible flat cable toward the chassis member by a portion other than the one end.

8. The image reading device according to claim 7, wherein
the scanning unit includes a rear surface steeply rising in a direction away from the chassis member on a side toward which the flexible flat cable extends from a position to which the one end of the flexible flat cable is attached,
the one end of the elastic sheet member is attached to the rear surface of the scanning unit, and
the elastic sheet member is arranged so as to be bent by the flexible flat cable such that a surface on a side attached to the rear surface is convex and so as to press the flexible flat cable toward the chassis member by reactive force of the bend.

9. The image reading device according to claim 7, wherein
the elastic sheet member includes a slit through which the flexible flat cable passes formed, presses the flexible flat cable between the one end and the slit, and
includes a section between the slit and the other end entering an inner side of the U-shaped bend of the flexible flat cable.

10. The image reading device according to claim 1, comprising:
a photoelectric conversion device mounted on the scanning unit to output the image signal according to the light reflected by the original, wherein
the flexible flat cable includes both the shielding layer and the impedance adjusting layer, and
the image signal output by the photoelectric conversion device is included in a signal transmitted from the scanning unit to the control unit by the flexible flat cable.

* * * * *